United States Patent
Wu (10) Patent No.: US 10,141,938 B2
(45) Date of Patent: Nov. 27, 2018

(54) STACKED COLUMNAR INTEGRATED CIRCUITS

(71) Applicant: Xilinx, Inc., San Jose, CA (US)

(72) Inventor: Ephrem C. Wu, San Mateo, CA (US)

(73) Assignee: XILINX, INC., San Jose, CA (US)

( * ) Notice: Subject to any disclaimer, the term of this patent is extended or adjusted under 35 U.S.C. 154(b) by 266 days.

(21) Appl. No.: 15/272,242

(22) Filed: Sep. 21, 2016

(65) Prior Publication Data

US 2018/0083635 A1    Mar. 22, 2018

(51) Int. Cl.
| | |
|---|---|
| *H03K 19/00* | (2006.01) |
| *H03K 19/177* | (2006.01) |
| *H01L 23/00* | (2006.01) |
| *H03K 19/0175* | (2006.01) |
| *H01L 27/06* | (2006.01) |

(52) U.S. Cl.
CPC ....... *H03K 19/17748* (2013.01); *H01L 24/17* (2013.01); *H01L 24/75* (2013.01); *H03K 19/0175* (2013.01); *H03K 19/17796* (2013.01); *H01L 27/0688* (2013.01)

(58) Field of Classification Search
None
See application file for complete search history.

(56) References Cited

U.S. PATENT DOCUMENTS

| | | | |
|---|---|---|---|
| 8,546,955 B1 | 10/2013 | Wu | |
| 9,405,337 B2 * | 8/2016 | Kim | G06F 1/206 |
| 9,554,073 B2 * | 1/2017 | Jin | H04N 5/378 |
| 9,571,076 B2 * | 2/2017 | Seo | H03K 5/12 |
| 2005/0051903 A1 * | 3/2005 | Ellsberry | H01L 23/49816 257/777 |
| 2013/0148450 A1 | 6/2013 | Wu et al. | |
| 2014/0143462 A1 * | 5/2014 | Yun | G06F 13/36 710/110 |
| 2015/0076324 A1 * | 3/2015 | Jin | H04N 5/378 250/208.1 |
| 2015/0162103 A1 * | 6/2015 | Oh | G11C 16/20 365/96 |

(Continued)

FOREIGN PATENT DOCUMENTS

WO    20130119309    8/2013

OTHER PUBLICATIONS

L. Peng, et. al., "Fine-pitch bumpless Cu—Cu bonding for wafer-onwaferstacking and its quality enhancement," 2010 IEEE International 3D Systems Integration Conference (3DIC), pp. 1-5, Nov. 16-18, 2010, Munich, Germany.

(Continued)

*Primary Examiner* — Jeffery L Williams
(74) *Attorney, Agent, or Firm* — Robert M. Brush (57) ABSTRACT

An example semiconductor device includes a first integrated circuit (IC) die including a first column of cascade-coupled resource blocks; a second IC die including a second column of cascade-coupled resource blocks, where an active side of the second IC die is mounted to an active side of the first IC die; and a plurality of electrical connections between the active side of the first IC and the active side of the second IC, the plurality of electrical connections including at least one electrical connection between the first column of cascade-coupled resource blocks and the second column of cascade-coupled resource blocks.

20 Claims, 9 Drawing Sheets

(56) References Cited

U.S. PATENT DOCUMENTS

| | | | | |
|---|---|---|---|---|
| 2015/0187404 A1* | 7/2015 | Oh | ............................ | G11C 8/18 |
| | | | | 365/154 |
| 2015/0311914 A1* | 10/2015 | Chae | ..................... | H03M 3/484 |
| | | | | 250/208.1 |
| 2016/0105166 A1* | 4/2016 | Seo | ......................... | H03K 5/12 |
| | | | | 327/399 |
| 2016/0352223 A1* | 12/2016 | Choo | ....................... | H03F 1/301 |
| 2017/0318488 A1* | 11/2017 | Adachi | ................... | H04L 43/16 |

OTHER PUBLICATIONS

William James Daily, et al., Principles and Practices of Interconnection Networks by (ISBN-13:978-0122007514); Chapter 5.1, 4 pages, Jan. 1, 2004, Morgan Kaufmann.

* cited by examiner

FIG. 8

STACKED COLUMNAR INTEGRATED CIRCUITS

TECHNICAL FIELD

Examples of the present disclosure generally relate to semiconductor devices and, in particular, to stacked columnar integrated circuits (ICs).

BACKGROUND

Programmable integrated circuits (ICs) are used to implement digital logic operations according to user configurable input. One example programmable IC is a field programmable gate array (FPGA). One type of FPGA includes columns of programmable tiles. The programmable tiles comprise various types of logic blocks, which can include, for example, input/output blocks (IOBs), configurable logic blocks (CLBs), dedicated random access memory blocks (BRAM), multipliers, digital signal processing blocks (DSPs), processors, clock managers, delay lock loops (DLLs), bus or network interfaces such as Peripheral Component Interconnect Express (PCIe) and Ethernet and so forth. Each programmable tile typically includes both programmable interconnect and programmable logic. The programmable interconnect typically includes a large number of interconnect lines of varying lengths interconnected by programmable interconnect points (PIPs). The programmable logic implements the logic of a user design using programmable elements that can include, for example, function generators, registers, arithmetic logic, and so forth. Some of the columns of specialized resources, such as BRAMs, DSPs, etc., can include cascade connections along one direction, e.g., from the bottom resource to the top resource. As cascade connections are embedded inside the resource column, their performance is guaranteed by design and is more efficient than pipelines build using CLBs and programmable interconnect.

Some semiconductor devices include multiple programmable ICs mounted to an interposer. For example, rather than manufacturing one large FPGA die, multiple smaller FPGA dies are manufactured, assembled, and interconnected on the interposer. The interposer serves as a high-density printed circuit board. However, due to the limited number of connections available on the interposer, the cascade connections in the columns of specialized resources do not cross the die boundary. Thus, the maximum cascade length is shorter than would be a single large FGPA die.

SUMMARY

Techniques for providing stacked columnar integrated circuits (ICs) are described. In an example, a semiconductor device includes a first integrated circuit (IC) die including a first column of cascade-coupled resource blocks; a second IC die including a second column of cascade-coupled resource blocks, where an active side of the second IC die is mounted to an active side of the first IC die; and a plurality of electrical connections between the active side of the first IC and the active side of the second IC, the plurality of electrical connections including at least one electrical connection between the first column of cascade-coupled resource blocks and the second column of cascade-coupled resource blocks.

In another example, a method of fabricating a semiconductor device includes forming a first integrated circuit (IC) die including a first column of cascade-coupled resource blocks; forming a second IC die including a second column of cascade-coupled resource blocks; and mounting an active side of the second IC die to an active side of the first IC die and forming a plurality of electrical connections between the active side of the first IC and the active side of the second IC, the plurality of electrical connections including at least one electrical connection between the first column of cascade-coupled resource blocks and the second column of cascade-coupled resource blocks.

In another example, a field programmable gate array (FPGA) includes a first column of cascade-coupled resource blocks disposed on a first integrated circuit (IC) die; a second column of cascade-coupled resource blocks disposed on a second IC die, where an active side of the second programmable IC die is mounted to an active side of the first programmable IC die; and a plurality of electrical connections between the active side of the first IC die and the active side of the second IC die, the plurality of electrical connections including at least one electrical connection between the first column of cascade-coupled resource blocks and the second column of cascade-coupled resource blocks.

These and other aspects may be understood with reference to the following detailed description.

BRIEF DESCRIPTION OF THE DRAWINGS

So that the manner in which the above recited features can be understood in detail, a more particular description, briefly summarized above, may be had by reference to example implementations, some of which are illustrated in the appended drawings. It is to be noted, however, that the appended drawings illustrate only typical example implementations and are therefore not to be considered limiting of its scope.

To facilitate understanding, identical reference numerals have been used, where possible, to designate identical elements that are common to the figures. It is contemplated that elements of one example may be beneficially incorporated in other examples.

DETAILED DESCRIPTION

Various features are described hereinafter with reference to the figures. It should be noted that the figures may or may not be drawn to scale and that the elements of similar structures or functions are represented by like reference numerals throughout the figures. It should be noted that the figures are only intended to facilitate the description of the features. They are not intended as an exhaustive description of the claimed invention or as a limitation on the scope of the claimed invention. In addition, an illustrated example need not have all the aspects or advantages shown. An aspect or an advantage described in conjunction with a particular example is not necessarily limited to that example and can be practiced in any other examples even if not so illustrated or if not so explicitly described.

Techniques for providing stacked columnar integrated circuits (ICs) are described. In examples described herein, the ICs, such as field programmable gate arrays (FPGAs) or other types of programmable ICs, include columns of specialized resources. The specialized resources are any resources other than configurable logic blocks and programmable interconnect blocks. The specialized columnar resources embed cascade signals pipelines along one direction, e.g., from the bottom resource block to the top resource block. The techniques described herein use active-on-active three dimensional (3D) stacking to double the maximum cascade length using two identical programmable IC dies. In various examples, the top programmable IC die is flipped about its bottom edge and mounted to the bottom IC die. This physical arrangement enables more dense inter-die connections than is attainable using active-on-passive (2.5D) stacking. The physical arrangement of the programmable IC dies enables the cascaded signals to form one or more rings (e.g., a one dimensional torus), which is a topology useful for algorithms that require data to recirculate around the resource blocks. The 3D die stack is in essence a 2D die folded onto itself along an axis perpendicular to the axis of the cascaded resource blocks. These and further aspects are described below with respect to the drawings.

Figure 1:
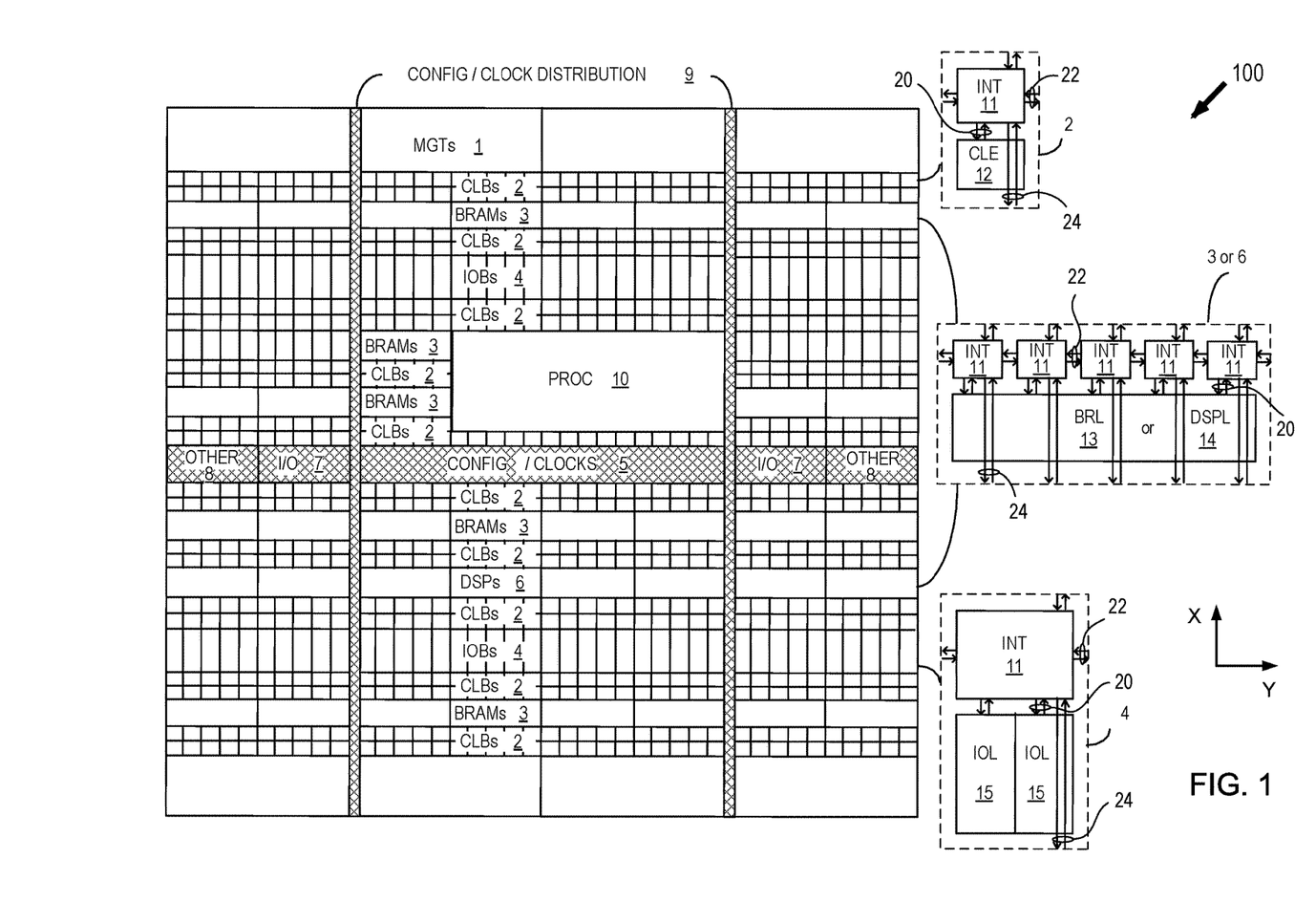
FIG. 1 illustrates an architecture of a field programmable gate array (FPGA) according to an example.

FIG. 1 illustrates an architecture of a field programmable gate array (FPGA) 100 that includes a large number of different programmable tiles including multi-gigabit transceivers ("MGTs") 1, configurable logic blocks ("CLBs") 2, random access memory blocks ("BRAMs") 3, input/output blocks ("IOBs") 4, configuration and clocking logic ("CONFIG/CLOCKS") 5, digital signal processing blocks ("DSPs") 6, specialized input/output blocks ("I/O") 7 (e.g., configuration ports and clock ports), and other programmable logic 8 such as digital clock managers, analog-to-digital converters, system monitoring logic, and so forth. Some FPGAs also include dedicated processor blocks ("PROC") 10. The FPGA 100 can be used as the programmable IC 118 shown in FIG. 1. In such case, the layer circuit(s) 120 are implemented using the programmable fabric of the FPGA 100.

In some FPGAs, each programmable tile can include at least one programmable interconnect element ("INT") 11 having connections to input and output terminals 20 of a programmable logic element within the same tile, as shown by examples included at the top of FIG. 1. Each programmable interconnect element 11 can also include connections to interconnect segments 22 of adjacent programmable interconnect element(s) in the same tile or other tile(s). Each programmable interconnect element 11 can also include connections to interconnect segments 24 of general routing resources between logic blocks (not shown). The general routing resources can include routing channels between logic blocks (not shown) comprising tracks of interconnect segments (e.g., interconnect segments 24) and switch blocks (not shown) for connecting interconnect segments. The interconnect segments of the general routing resources (e.g., interconnect segments 24) can span one or more logic blocks. The programmable interconnect elements 11 taken together with the general routing resources implement a programmable interconnect structure ("programmable interconnect") for the illustrated FPGA.

In an example implementation, a CLB 2 can include a configurable logic element ("CLE") 12 that can be programmed to implement user logic plus a single programmable interconnect element ("INT") 11. A BRAM 3 can include a BRAM logic element ("BRL") 13 in addition to one or more programmable interconnect elements. Typically, the number of interconnect elements included in a tile depends on the height of the tile. In the pictured example, a BRAM tile has the same height as five CLBs, but other numbers (e.g., four) can also be used. A DSP tile 6 can include a DSP logic element ("DSPL") 14 in addition to an appropriate number of programmable interconnect elements. An 10B 4 can include, for example, two instances of an input/output logic element ("IOL") 15 in addition to one instance of the programmable interconnect element 11. As will be clear to those of skill in the art, the actual I/O pads connected, for example, to the I/O logic element 15 typically are not confined to the area of the input/output logic element 15.

In the pictured example, a horizontal area near the center of the die (shown in FIG. 11) is used for configuration, clock, and other control logic. Vertical columns 9 extending from this horizontal area or column are used to distribute the clocks and configuration signals across the breadth of the FPGA.

Some FPGAs utilizing the architecture illustrated in FIG. 1 include additional logic blocks that disrupt the regular columnar structure making up a large part of the FPGA. The additional logic blocks can be programmable blocks and/or dedicated logic. For example, processor block 10 spans several columns of CLBs and BRAMs. The processor block 10 can various components ranging from a single microprocessor to a complete programmable processing system of microprocessor(s), memory controllers, peripherals, and the like.

Note that FIG. 1 is intended to illustrate only an exemplary FPGA architecture. For example, the numbers of logic blocks in a row, the relative width of the rows, the number and order of rows, the types of logic blocks included in the rows, the relative sizes of the logic blocks, and the interconnect/logic implementations included at the top of FIG. 1 are purely exemplary. For example, in an actual FPGA more than one adjacent row of CLBs is typically included wherever the CLBs appear, to facilitate the efficient implementation of user logic, but the number of adjacent CLB rows varies with the overall size of the FPGA.

Figure 2A:
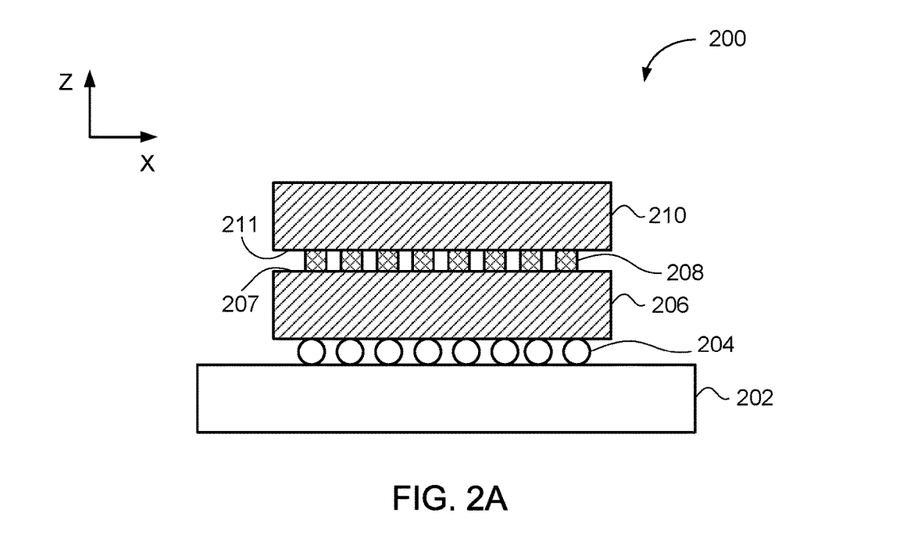
FIG. 2A is a cross-sectional view of a semiconductor device according to an example.

FIG. 2A is a cross-sectional view of a semiconductor device 200 according to an example. The semiconductor device 200 includes a first programmable integrated circuit (IC) die 206 and a second programmable IC die 210. The second programmable IC die 210 is mounted on the first programmable IC die 206. As described herein, each programmable IC die of the device 200 includes circuitry formed in an X-Y plane. That is, each programmable IC die of the device 200 includes a length and a width defined in the X-Y plane. The layout of the circuitry in the X-Y plane is referred to herein as a floorplan. The cross-section shown in FIG. 2A is taken along the X-axis. The height of the semiconductor device 20 is defined along the Z-axis, which is perpendicular to the X-Y plane. As shown in FIG. 2A, the programmable IC die 210 is stacked on the programmable IC die 206 along the Z-axis (i.e., the floorplan of each programmable IC die is at a different position along the Z-axis).

The programmable IC die 206 includes an active side 207, and the programmable IC die 210 includes an active side 211. The programmable IC die 210 is mounted on the programmable IC die 206 such that the active side 211 faces the active side 207. That is, the programmable IC dies are mounted face-to-face (also referred to as active-on-active). A plurality of electrical connections 208 are disposed between the programmable IC die 206 and the programmable IC die 210 (also referred to as "inter-die connections"). The electrical connections 208 electrically couple circuitry on the active side 211 with other circuitry on the active side 207. The electrical connections 208 can be implemented using solder balls, solder bumps, metal pillars, metal vias, or the like. In some examples, the electrical connections 208 are also mechanical connections that secure the programmable IC die 210 to the programmable IC die 206. In an example, the electrical connections 208 are implemented using known bump-less copper-to-copper (Cu—Cu) bonding techniques.

Either or both of the programmable IC dies 206, 210 can include through silicon vias (TSVs) that electrically connect the active side thereof with electrical contacts on the backside thereof. In the example shown in FIG. 2A, the programmable IC die 206 includes TSVs (not shown) that electrically connect the active side 207 with electrical contacts 204 disposed on the backside thereof. The electrical contacts 204 can be solder balls, solder bumps, or the like. The electrical contacts 204 can be electrically and mechanically coupled to a substrate 202, such as a package substrate or printed circuit board (PCB). In examples where the programmable IC 210 includes contacts on its backside, the semiconductor device 200 can include wire bonds or the like that electrically couple those contacts to the substrate 202.

In the examples above, the semiconductor device 200 is described as including programmable IC dies 206, 210. In other examples, the semiconductor device 200 can include other types of IC dies, such as application specific integrated circuit (ASIC) dies. Thus, while programmable IC dies are described in various examples herein, it is to be understood that the techniques described herein are applicable to other types of IC dies, including ASIC dies.

Figure 2B:
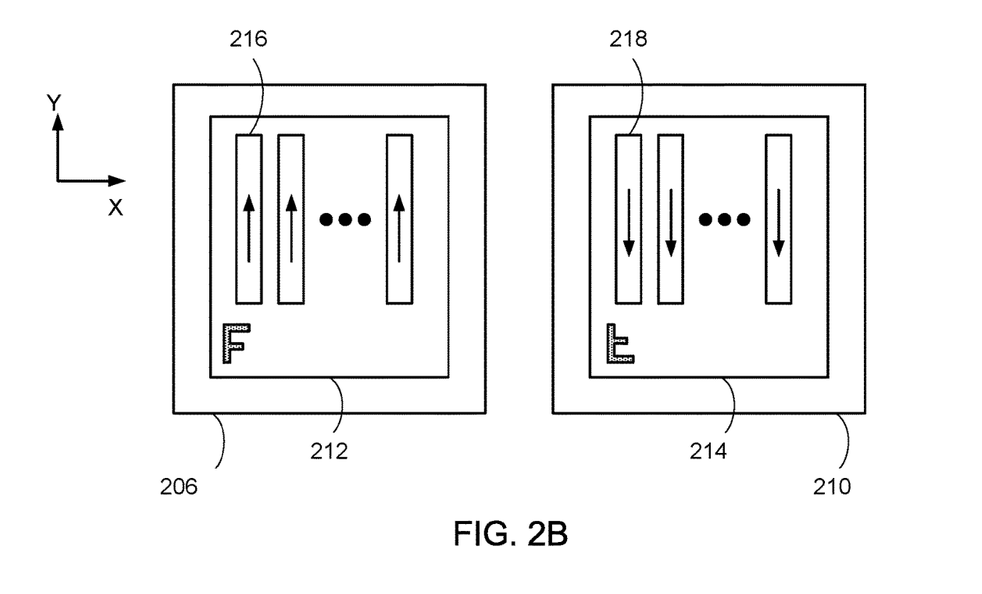
FIG. 2B shows schematic views of the circuitry of the programmable IC dies shown in FIG. 2A.

FIG. 2B shows schematic views of the circuitry of the programmable IC dies 206 and 210. The programmable IC die 206 includes a floorplan 212. The floorplan 212 includes columns of resource blocks, including columns of cascaded resource blocks ("cascaded columns 216"). As shown in FIG. 2B, the columns of the floorplan 212 are parallel with the Y-axis, and the rows of the floorplan 212 are parallel with the X-axis. In an example, the programmable IC die 206 can be an FPGA, where the floorplan 212 is similar to that shown in FIG. 1. The columns of resource blocks include columns of CLBs, BRAMs, DSPs, and the like. The resource blocks in the cascaded columns 216 can be cascaded along the Y-axis to form pipelines of resource blocks (also referred to as "cascades"). That is, each resource block can transmit to and/or receive from a resource block in adjacent row(s)). In the example shown, the cascades that can be formed in the cascaded columns 216 are unidirectional as indicated by the arrows. Example resources of the cascaded columns 216 include BRAM blocks, DSP blocks, and like type specialized resource blocks (as opposed to CLBs). Cascaded resource blocks can implement various functions, such as shared busses for BRAMs and chained adders for DSPs. The circuitry for cascading the resource blocks is embedded inside the cascaded columns 216 and is not part of the general programmable interconnect. Thus, the performance of cascaded resource blocks is guaranteed by design and is faster and more efficient than pipelines built with CLBs and INTs.

The programmable IC die 210 can be the same as the programmable IC die 206. That is, the programmable IC dies 206, 210 can be manufactured with the same set of masks. As shown in FIG. 2B, the programmable IC die 210 is flipped for face-to-face mounting with the programmable IC die 206. That is, the programmable IC die 210 is flipped 180 degrees about its bottom edge. In particular, the programmable IC die 210 includes a floorplan 214, which can be common with the floorplan 212 (before being flipped). The floorplan 214 includes columns of resource blocks, including cascaded columns 218. Since the floorplan 214 of the programmable IC die 210 is flipped with respect to the floorplan 212, the direction of the cascades that can be formed in the cascaded columns 218 is opposite that of the cascades that can be formed in the cascaded columns 216.

As described further herein, each resource block in a column can transmit its output to another resource block in the Y- and/or Z-direction. Further, each resource block can transmit its output in the X direction to the programmable interconnect (e.g., non-cascaded output). Each resource block in a column can receive its input from another resource block in the Y- and/or Z-direction. Further, each resource block in a column can receive its input in the X direction from the programmable interconnect (e.g., non-cascaded input). Connections in the Z-direction are implemented using the electrical connections 208 between the dies 206, 210. Since the cascades that can be formed on the die 206 are in the opposite direction of the cascades that can be formed on the die 210, connections in the Z-direction can be used to implement rings, as described further below.

Figure 4:
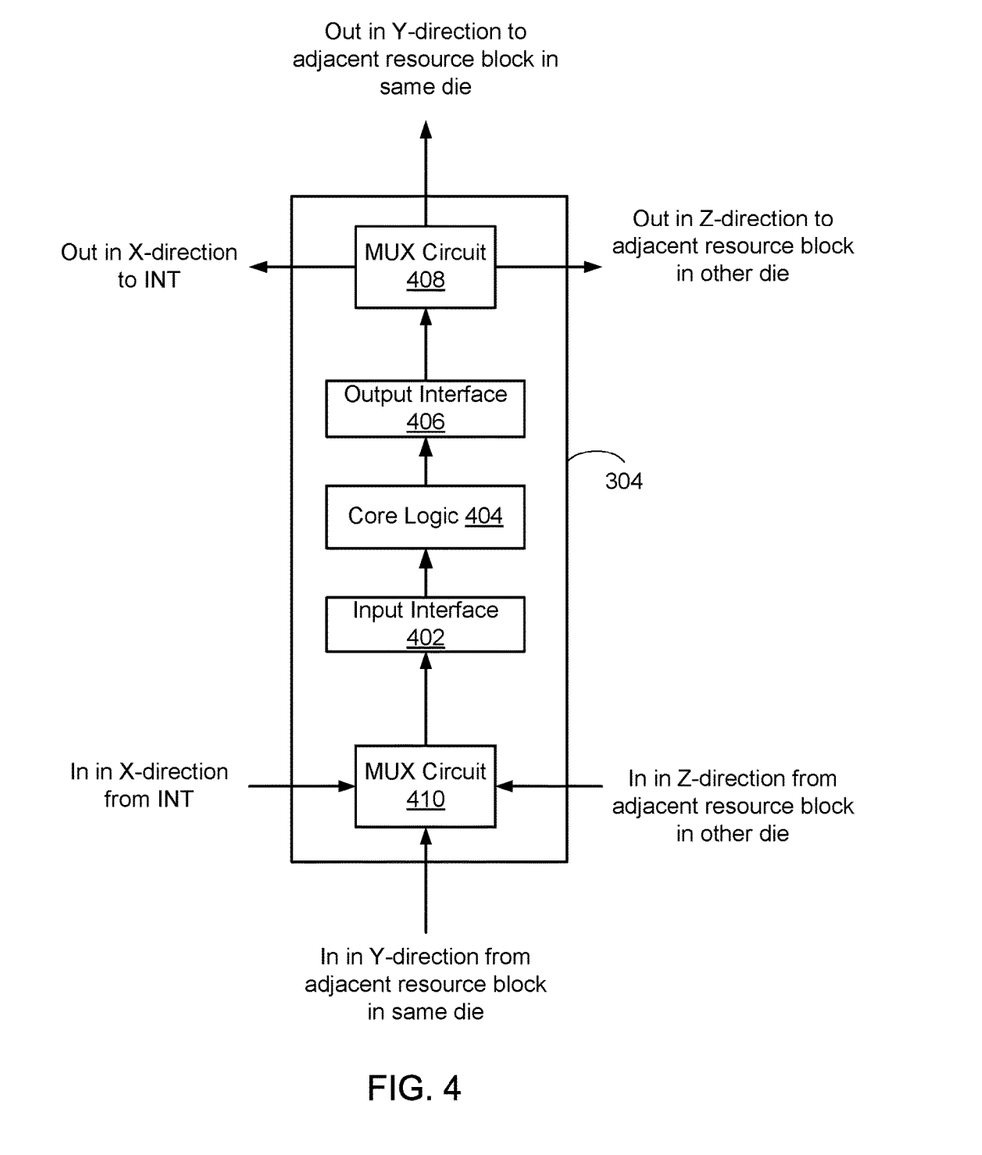
FIG. 4 is a block diagram depicting a resource block according to an example.

FIG. 4 is a block diagram depicting a resource block 304 according to an example. The resource block 304 includes an input interface 402, core logic 404, and an output interface 406. The resource block 304 also includes cascading circuits, which include multiplexer (MUX) circuit 408 and MUX circuit 410. Although the cascading circuits are shown as being part of the resource block 304, in other examples, the cascading circuits can be external to the resource block. The MUX circuit 410 is coupled to the input interface 402. The input interface 402 is coupled to the core logic 404. The core logic 404 is coupled to the output interface 406. The output interface 406 is coupled to the MUX circuit 408. The core logic 404 is configured to implement the core function of the resource block, such as a memory function for a BRAM block or a DSP function for a DSP block. The input interface 402 receives and provides input signals to the core logic 404. The core logic 404 provides output signals through the output interface 406.

The input interface 402 can receive signals from three different sources depending on the configuration of the MUX circuit 410. The MUX circuit 410 can be controlled to select input in the X-direction from the programmable interconnect. Alternatively, the MUX circuit 410 can be controlled to select input in the Y-direction from an adjacent resource block in the column on the same die. Alternatively, the MUX circuit 410 can be controlled to select input in the Z-direction from an adjacent resource block in the other die. The MUX circuit 410 can be controlled using external control logic (not shown) or through the configuration memory of the programmable IC.

The output interface 406 can transmit signals to three different destinations depending on the configuration of the MUX circuit 408. The MUX circuit 408 can be controlled to select output in the X-direction to the programmable interconnect. Alternatively, the MUX circuit 408 can be controlled to select output in the Y-direction to an adjacent resource block in the column on the same die. Alternatively, the MUX circuit 408 can be controlled to select output in the Z-direction to an adjacent resource block on the other die. The MUX circuit 408 can be controlled using external control logic (not shown) or through configuration memory of the programmable IC.

FIG. 4 shows a general form of the resource block 304. In another example of the resource block 304, the input interface 402 can be configured to receive from only two sources (e.g., only from the X- and Y-directions or only from the X- and Z-directions). In another example, the output interface 306 can be configured to transmit to only two destinations (e.g., only in the X- and Y-directions or only in the X- and Z-directions). Note that the inputs and outputs shown in FIG. 4 can receive and transmit multiple signals in parallel (e.g., the inputs/outputs can be multiple bits wide).

Figure 3A:
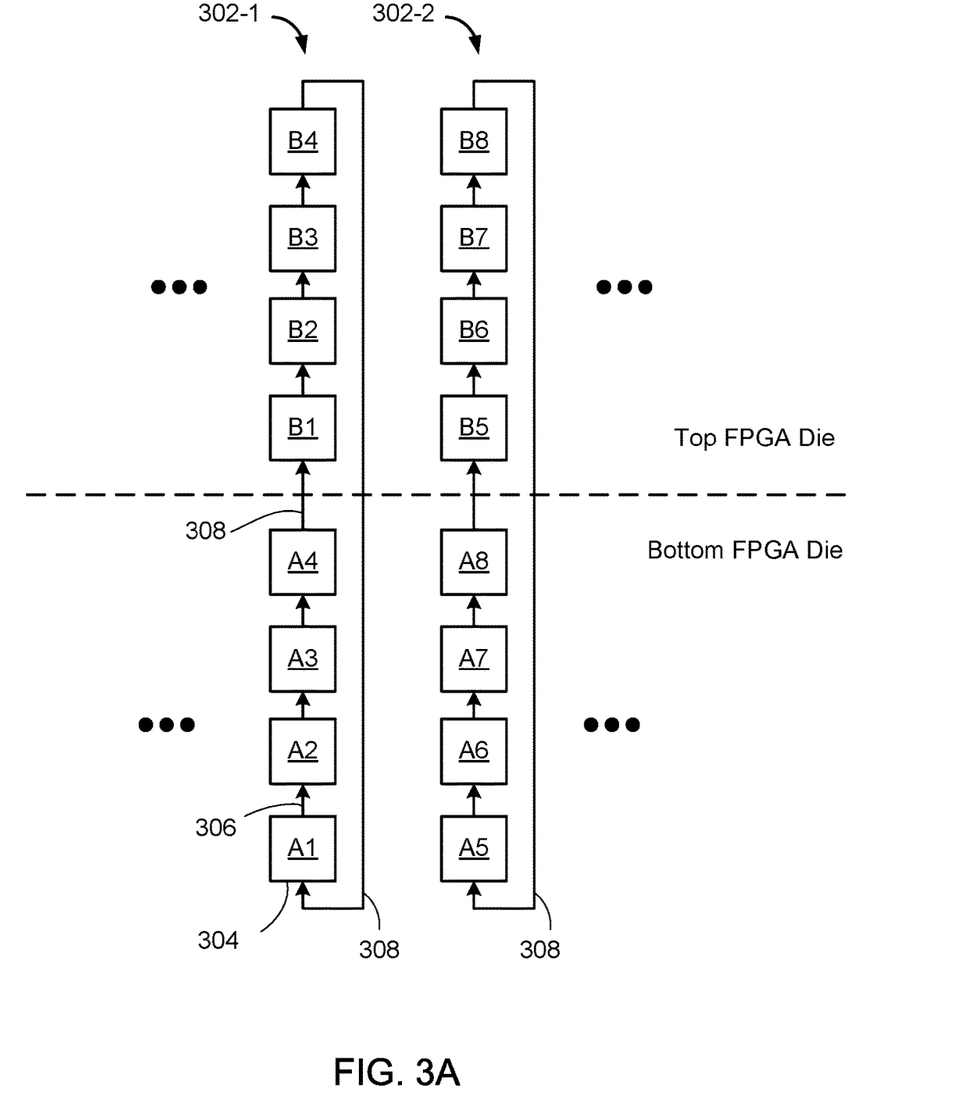
FIG. 3A illustrates a configuration of cascaded resource blocks in a semiconductor device according to an example.

FIG. 3A illustrates a configuration of cascaded resource blocks in the semiconductor device 200 according to an example. In the example, resource blocks A1 through A8 are disposed in the programmable IC die 206 (referred to as the bottom FPGA die), and the resource blocks B1 through B8 are disposed in the programmable IC die 210 (referred to as the top FPGA die). The resource blocks A1 through A4 and B1 through B4 form a cascaded resource column 302-1. The resource blocks A5 through A8 and B5 through B8 form a cascaded resource column 302-2. Each of the resource blocks A1 through A8 and B1 through B8 are configured the same or similar to the resource block 304 shown in FIG. 4. Connections to and from the resource blocks in the X-direction are omitted for clarity.

Within the bottom FPGA die, the resource blocks A1 through A4 are successively coupled using electrical connections 306 formed in the active area of the bottom FPGA die. That is, the output of resource block A1 is coupled to the input of resource block A2; the output of resource block A2 is coupled to the resource block A3; and so on. Likewise, the resource blocks A5 through A8 are successively coupled using electrical connections 306 formed in the active area of the bottom FPGA die. Cascading circuitry in the resource blocks can be configured to connect the blocks A1 through A4, and the blocks A5 through A8, in cascade.

Within the top FPGA die, the resource blocks B1 through B4 are successively coupled using electrical connections formed in the active area of the top FPGA die. That is the output of resource block B1 is coupled to the input of resource block B2; the output of resource block B2 is coupled to the resource block B3; and so on. Likewise, the resource blocks B5 through B8 are successively coupled using electrical connections formed in the active area of the top FPGA die. Cascading circuitry in the resource blocks can be configured to connect the blocks B1 through B4, and the blocks B5 through B8, in cascade.

Further, the output of the resource block A4 is coupled to the input of the resource block B1 through an electrical connection 308. The electrical connection 308 is implemented by one or more of the inter-die electrical connections 208 (depending on the width of the cascaded signal). The output of the resource block B4 is coupled to the input of the resource block A1 through another electrical connection 308 (e.g., another set of inter-die electrical connections). The resource blocks A5 through A8 and B5 through B8 can be configured similarly. The programmable IC dies 206, 210 can include any number of cascaded columns 302 configured as shown in FIG. 3A.

In individual columnar FPGAs, adjacent resource blocks along the Y direction on the die can be interconnected to form a chain within a resource column without consuming any programmable routing resources (e.g., INTs). An example embedded cascade connection is A5->A6->A7->A8, as shown in FIG. 3A. In the semiconductor device 200 as shown in FIG. 3A, the length of the cascaded resource column is increased, i.e., A5->A6->A7->A8->B5->B6->B7->B8. Further, the output at B8 can be coupled to the input at A5 to form a ring (e.g., a one dimensional (1D) torus). The feedback from B8 to A5 is implemented through an electrical connection between dies. In a single programmable IC, such feedback would require a pipeline through the programmable fabric, which consumes fabric resources and is slower than in the semiconductor device 200.

Figure 3B:
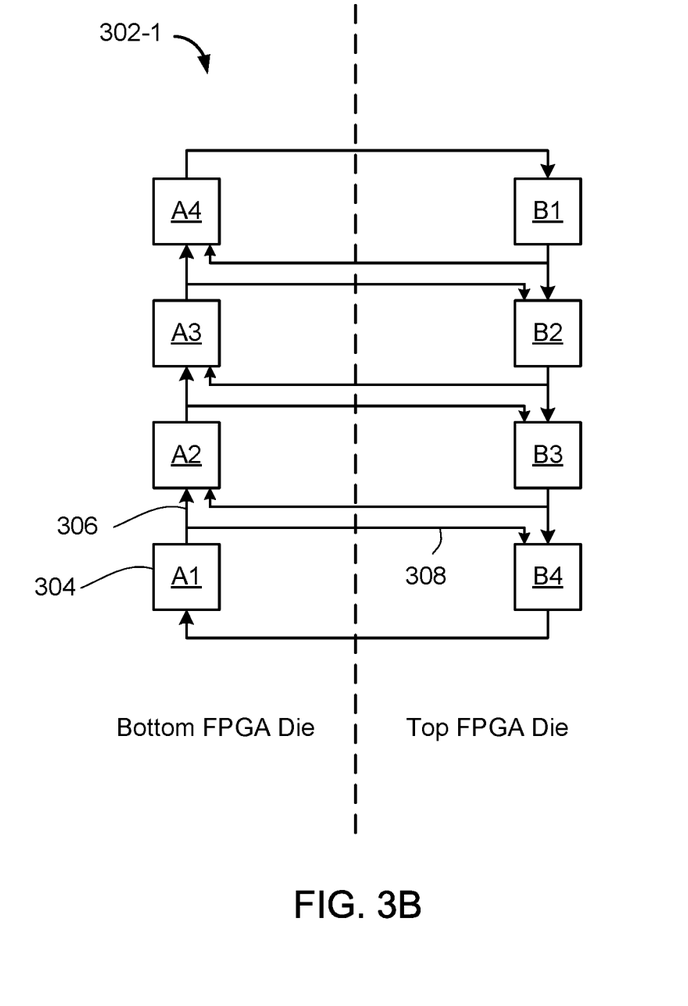
FIG. 3B illustrates a configuration of cascaded resource blocks in a semiconductor device according to another example.

FIG. 3B illustrates a configuration of cascaded resource blocks in the semiconductor device 200 according to another example. The present example shows the cascaded resource column 302-1 having the resource blocks A1 through A4 and B1 through B4, as described above. In the present example, the output of each resource block is coupled to one resource block in the same die and one resource block in the other die. For example, the output of the resource block A1 is coupled to the input of the resource block A2 and the input of the resource block B4; the output of the resource block A2 is coupled to the input of the resource block A3 and the input of the resource block B3; and so on. Thus, each resource block (other than the last resource blocks A4 and B4) can transmit its output not only in the Y direction to another resource block in the same column, but also in the Z direction to another resource block in the other die. In the present example, the last resource blocks A4 and B4 can transmit output in the Z direction. In other examples, any resource block can transmit output in the Z direction, as described further below. Similarly, each resource block (other than the first resource blocks A1 and B1) can receive its input not only from another block in the Y direction, but also from another block in the Z direction in the other die. The first resource blocks A1 and B1 can receive input from the Z-direction, Similar to the configuration shown in FIG. 3A, the maximum length of the cascaded resource column is increased with respect to the single programmable IC. However, in FIG. 3B, the length of a ring of cascaded resources is variable. Further, a given column can be configured with more than one ring of cascaded resources.

In either FIG. 3A or FIG. 3B, the feedback connections of the 1D torus are interconnected in the Z-direction with inter-die electrical connections (e.g., vias). The remaining inter-block connections are embedded within the columns. As a result, the performance of the 1D torus is guaranteed to be higher than what can be achieved with general fabric routing. Furthermore, because the interconnects are embedded in the columns, FPGA electronic design automation (EDA) tools can map circuit designs to 1D tori and guarantee timing closure at high clock rates. Furthermore, because the columnar cascades run in opposite directions between the two dies, a 1D torus can be split between the two dies evenly. In contrast, with a single die with unidirectional columnar cascades, the wrap-around connections must be pipelined with fabric resources. The semiconductor device 200 provides for more energy efficient solutions for 1D torus networks.

To form rings extending into the Z dimension, the cascades on the two dies are anti-parallel to each other. To align the transmit and receive pins for every cascaded block across the two dies in the Z direction, two symmetry constraints apply: 1) The resource blocks along a column must be placed symmetrically about the horizontal centerline of the die; and 2) the receive and transmit pins must be symmetrical about the horizontal centerline of the block. In some examples, the fabrication process can include a wafer-on-wafer process. In such case, a third symmetry constraint is that the dies must be placed on the wafer symmetric about the horizontal centerline of the wafer.

In the examples of FIGS. 3A and 3B, the cascades that can be implemented are unidirectional. In other examples, the cascaded couplings between resource blocks can be bidirectional. Thus, a first block (e.g., A2) can transmit its output to an input of a second block (e.g., A3), and the second block (e.g., A3) can transmit its output to an input of the first block (e.g., A2). Bidirectional cascaded couplings can be implemented in both the Y- and Z-directions in place of the unidirectional cascaded couplings.

Figure 5:
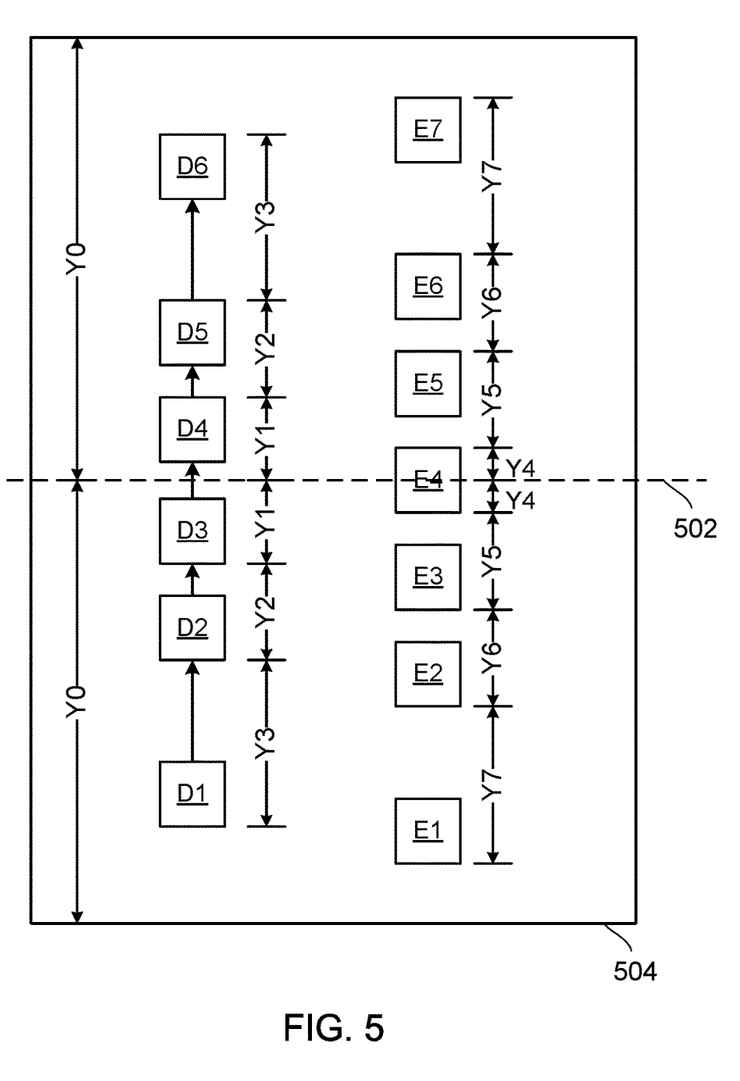
FIG. 5 depicts a schematic diagram of a layout of two columns of cascaded resource blocks according to an example.

FIG. 5 depicts a schematic diagram of a layout 504 of two columns of cascaded resource blocks according to an example. A horizontal centerline 502 divides the layout 504 into top and bottom halves each having a length Y0 along the Y-direction. One column of cascaded resource blocks includes resource blocks D1 through D6. This column includes an even number of resource blocks, and hence the horizontal centerline 502 passes half-way between the two blocks in the center (e.g., blocks D3 and D4). The distances Y1, Y2, and Y3 separating the blocks are the same in each half to ensure symmetry about the horizontal centerline 502. Another column of cascaded resource blocks includes resource blocks E1 through E7. This column includes an odd number of resource blocks, and hence the horizontal centerline 502 passes through the center of the middle block (e.g., E4). The distances Y4, Y5, Y6, and Y7 separating the blocks are the same in each half to ensure symmetry about the horizontal centerline 502.

Figure 6:
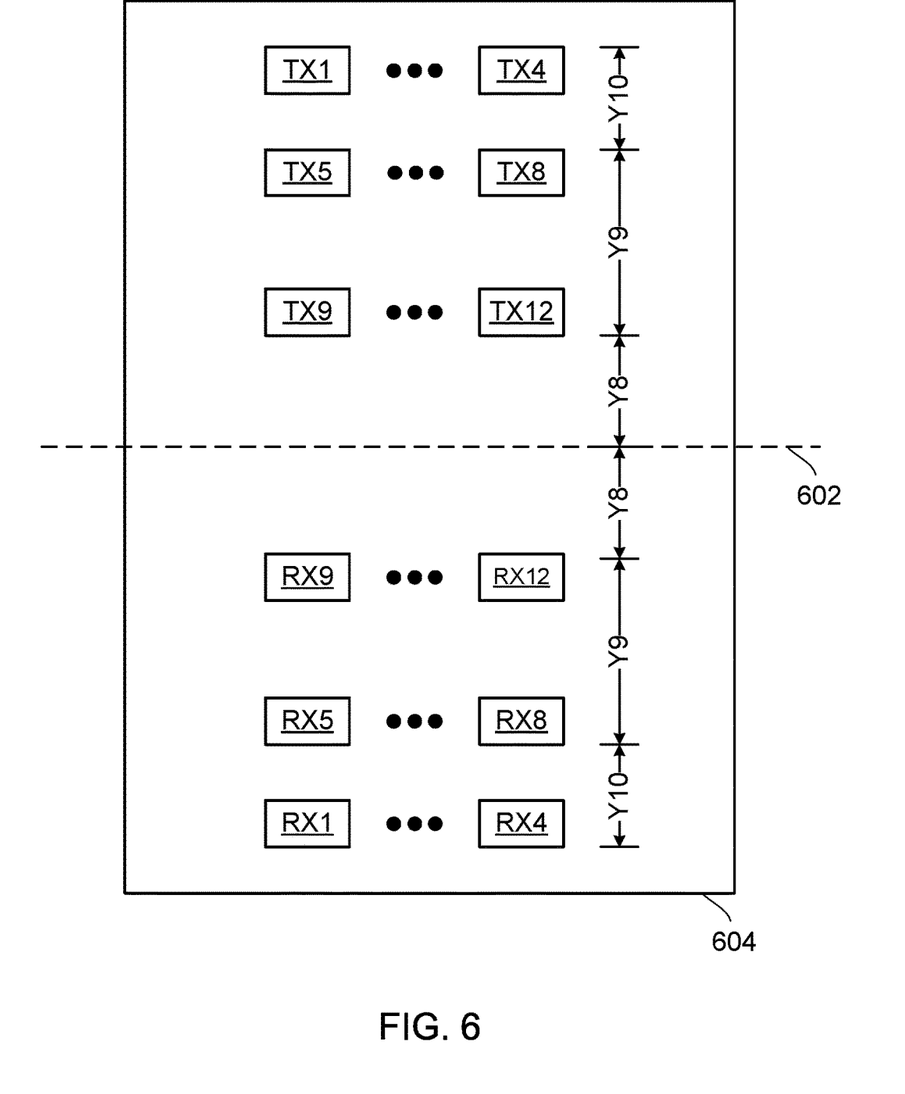
FIG. 6 depicts a schematic diagram of a layout of a resource block according to an example.

FIG. 6 depicts a schematic diagram of a layout 604 of a resource block according to an example. A horizontal centerline 602 divides the layout 604 into top and bottom halves. The top half of the layout 604 includes transmit pins TX1 through TX12, and the bottom half of the layout 604 includes receive pins RX1 through RX12. While 12 transmit and receive pins are shown, in general, a resource block can have N transmit and receive pins, where N is a positive integer. The width N depends on the number of inter-die signals being cascaded between a pair of resource blocks. The rows of transmit pins are separated by distances Y8, Y9, and Y10. Likewise, the rows of receive pins are separated by the same distances Y8, Y9, and Y10 to ensure symmetry about the horizontal centerline 602. In this manner, the transmit pins of one block in one die are aligned with the receive pins of another block in the other die. The transmit and receive pin pairs are electrically connected by the inter-die electrical connections.

Figure 7:
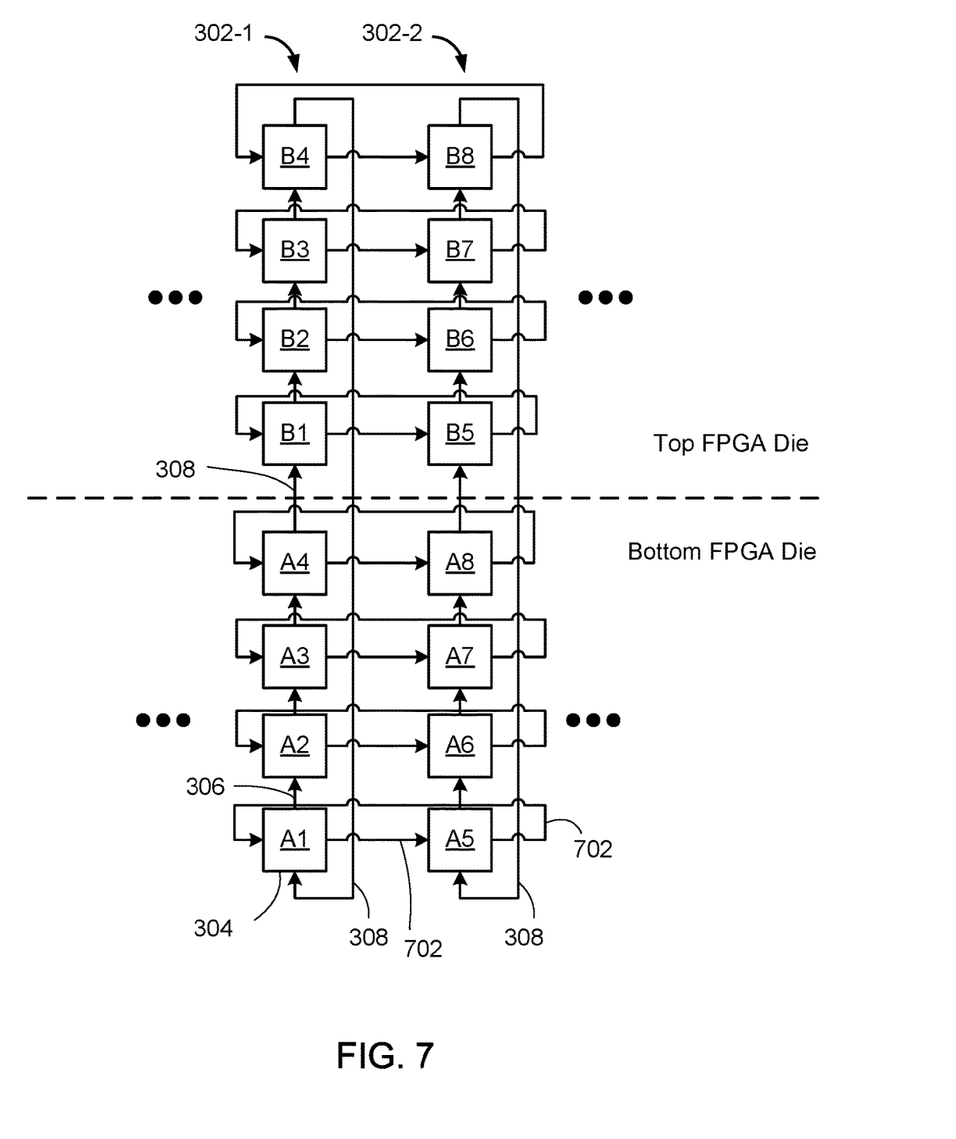
FIG. 7 illustrates a configuration of cascaded resource blocks in a semiconductor device according to another example.

FIG. 7 illustrates a configuration of cascaded resource blocks in the semiconductor device 200 according to another example. In the example, resource blocks A1 through A8 are disposed in the programmable IC die 206 (referred to as the bottom FPGA die), and the resource blocks B1 through B8 are disposed in the programmable IC die 210 (referred to as the top FPGA die). The resource blocks A1 through A4 and B1 through B4 form a cascaded resource column 302-1. The resource blocks A5 through A8 and B5 through B8 form a cascaded resource column 302-2. Each of the resource blocks A1 through A8 and B1 through B8 are configured the same or similar to the resource block 304 shown in FIG. 4.

Further, the semiconductor device 200 in the present example includes horizontal cascades along the X-direction. Thus, the blocks A1 and A5 are cascaded along the X-direction; the blocks A2 and A6 are cascaded along the X-direction; and so on. In one example, the horizontal cascades are implemented using the programmable fabric of the FPGA (e.g., CLB and INT resources). In another example, the horizontal cascades are implemented using dedicated cascading circuits similar to those described above for connections in the Y- and Z-directions. The configuration shown in FIG. 7 allows for the formation of 2D tori networks. Although unidirectional cascades are shown, in other examples, the cascades in the Y-, Z-, and/or X-directions can be bidirectional. Further, while only two cascade connections are shown in the Z-direction, the semiconductor device 200 can include more than two, such as that shown in FIG. 3B.

Figure 8:
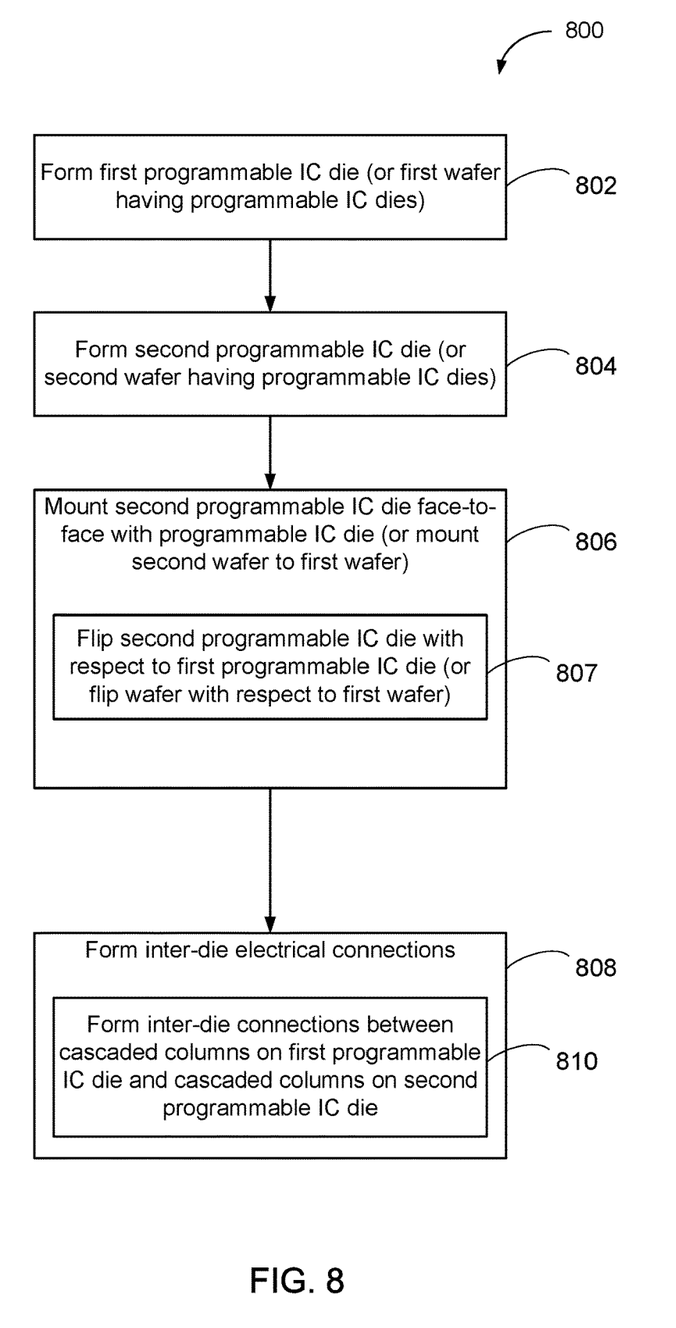
FIG. 8 is a flow diagram depicting a method of fabricating a semiconductor device according to an example.

FIG. 8 is a flow diagram depicting a method 800 of fabricating a semiconductor device according to an example. At step 802, a first programmable IC die is formed. In an example, the first programmable IC die is formed on a wafer along with a plurality of other programmable IC dies. The first programmable IC die (and other dies on a wafer) include cascaded columns of resource blocks, as described above. At step 804, a second programmable IC die is formed. In an example, the second programmable IC die is formed on a wafer along with a plurality of other programmable IC dies. The second programmable IC die (and other dies on a wafer) include cascaded columns of resource blocks, as described above. In an example, the second programmable IC die is identical to the first programmable IC die.

At step 804, the second programmable IC die is mounted to the first programmable IC die face-to-face. In case the dies are formed on wafers, the second wafer is mounted to the first wafer. During the step of mounting, at step 807, the second programmable IC die is flipped about its bottom edge with respect to the first programmable IC die prior to being mounted. In case the dies are formed on wafers, the second wafer is flipped with respect to the first wafer. At step 808, inter-die connections are formed between the second and first programmable IC dies (or the programmable IC dies on the second and first wafers). The inter-die electrical connections can be copper pillars or vias that are formed using a bumpless Cu—Cu bonding technique. Alternatively, the inter-die electrical connections can be solder balls, solder bumps, or the like that are reflowed to form the electrical connections. During step 808, at step 810, inter-die connections are formed between cascaded columns on the first programmable IC die and cascaded columns on the second programmable IC die (or between cascaded columns on programmable dies of the first and second wafers). The cascaded columns can be coupled in the Z-direction as described in the various examples above.

While the foregoing is directed to specific examples, other and further examples may be devised without departing from the basic scope thereof, and the scope thereof is determined by the claims that follow.

What is claimed is:
1. A semiconductor device, comprising:
a first integrated circuit (IC) die including a first column of cascade-coupled resource blocks;

a second IC die including a second column of cascade-coupled resource blocks, where an active side of the second IC die is mounted to an active side of the first IC die; and a plurality of electrical connections between the active side of the first IC and the active side of the second IC, the plurality of electrical connections including at least one electrical connection between the first column of cascade-coupled resource blocks and the second column of cascade-coupled resource blocks.

2. The semiconductor device of claim 1, wherein the first IC die and the second IC die include a common floorplan, and wherein the second IC die is flipped with respect to the first IC die.

3. The semiconductor device of claim 1, wherein the first column of cascade-coupled resource blocks is symmetrical about a centerline of the first IC die and the second column of cascade-coupled resource blocks is symmetrical about a centerline of the second IC die.

4. The semiconductor device of claim 1, wherein the at least one electrical connection includes an electrical connection between at least one resource block in the first column of cascade-coupled resource blocks and a respective at least one resource block in the second column of cascade-coupled resource blocks.

5. The semiconductor device of claim 1, wherein each of the first column of cascade-coupled resource blocks and the second column of cascade-coupled resource blocks includes a unidirectional cascade.

6. The semiconductor device of claim 1, wherein each of the first column of cascade-coupled resource blocks and the second column of cascade-coupled resource blocks includes a bidirectional cascade.

7. A method of fabricating a semiconductor device, comprising:
forming a first integrated circuit (IC) die including a first column of cascade-coupled resource blocks;
forming a second IC die including a second column of cascade-coupled resource blocks;
mounting an active side of the second IC die to an active side of the first IC die and forming a plurality of electrical connections between the active side of the first IC and the active side of the second IC, the plurality of electrical connections including at least one electrical connection between the first column of cascade-coupled resource blocks and the second column of cascade-coupled resource blocks.

8. The method of claim 7, wherein the first column of cascade-coupled resource blocks is parallel to a Y-axis of the first IC die and is symmetrical about an X-axis of the first IC die perpendicular to the Y-axis thereof, and wherein the second column of cascade-coupled resource blocks is parallel to a Y-axis of the second IC die and is symmetrical about an X-axis of the second IC die perpendicular to the Y-axis thereof.

9. The method of claim 7, wherein the step of mounting includes:
flipping the second IC die with respect to the first IC die.

10. The method of claim 7, wherein the at least one electrical connection includes an electrical connection between at least one resource block in the first column of cascade-coupled resource blocks and a respective at least one resource block in the second column of cascade-coupled resource blocks.

11. The method of claim 7, wherein each of the first column of cascade-coupled resource blocks and the second column of cascade-coupled resource blocks includes a unidirectional cascade.

12. The method of claim 7, wherein each of the first column of cascade-coupled resource blocks and the second column of cascade-coupled resource blocks includes a bidirectional cascade.

13. The method of claim 7, wherein the first IC die is formed on a first wafer, the second IC die is formed on a second wafer, and the step of mounting comprises mounting the first wafer to the second wafer.

14. A field programmable gate array (FPGA), comprising:
a first column of cascade-coupled resource blocks disposed on a first integrated circuit (IC) die;
a second column of cascade-coupled resource blocks disposed on a second IC die, where an active side of the second programmable IC die is mounted to an active side of the first programmable IC die; and
a plurality of electrical connections between the active side of the first IC die and the active side of the second IC die, the plurality of electrical connections including at least one electrical connection between the first column of cascade-coupled resource blocks and the second column of cascade-coupled resource blocks.

15. The FPGA of claim 14, wherein the first IC die and the second IC die include a common floorplan, and wherein the second IC die is flipped with respect to the first IC die.

16. The FPGA of claim 14, wherein the first column of cascade-coupled resource blocks is symmetrical about a centerline of the first programmable IC die and the second column of cascade-coupled resource blocks is symmetrical about a centerline of the second programmable IC die.

17. The FPGA of claim 14, wherein the at least one electrical connection includes an electrical connection between at least one resource block in the first column of cascade-coupled resource blocks and a respective at least one resource block in the second column of cascade-coupled resource blocks.

18. The FPGA of claim 14, wherein each of the first column of cascade-coupled resource blocks and the second column of cascade-coupled resource blocks includes a unidirectional cascade.

19. The FPGA of claim 14, wherein each of the first column of cascade-coupled resource blocks and the second column of cascade-coupled resource blocks includes a bidirectional cascade.

20. The FPGA of claim 14, wherein each of the first column of cascade-coupled resource blocks and the second column of cascade-coupled resource blocks are specialized resource blocks other than configurable logic blocks and programmable interconnect blocks.

* * * * *